United States Patent
Lee

(10) Patent No.: US 9,834,112 B2
(45) Date of Patent: Dec. 5, 2017

(54) BATTERY STATE OF CHARGE ESTIMATION BASED ON REDUCED ORDER ELECTROCHEMICAL MODELS

(71) Applicant: Ford Global Technologies, LLC, Dearborn, MI (US)

(72) Inventor: Tae-Kyung Lee, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 122 days.

(21) Appl. No.: 15/064,650

(22) Filed: Mar. 9, 2016

(65) Prior Publication Data
US 2017/0259689 A1    Sep. 14, 2017

(51) Int. Cl.
| | | |
|---|---|---|
| H02J 7/00 | (2006.01) | |
| H01M 10/44 | (2006.01) | |
| B60L 11/00 | (2006.01) | |
| B60L 11/18 | (2006.01) | |
| H01M 10/46 | (2006.01) | |
| H01M 10/0525 | (2010.01) | |

(52) U.S. Cl.
CPC ..... *B60L 11/1862* (2013.01); *H01M 10/0525* (2013.01); *H01M 10/44* (2013.01); *H01M 10/46* (2013.01); *H01M 2220/20* (2013.01); *H02J 7/00* (2013.01)

(58) Field of Classification Search
CPC .... H02J 7/00; B60L 11/1862; H01M 2220/20
USPC ................................ 320/104, 109, 132, 149
See application file for complete search history.

(56) References Cited

U.S. PATENT DOCUMENTS

| | | | |
|---|---|---|---|
| 8,099,180 B2 | 1/2012 | Schoch | |
| 9,071,071 B2* | 6/2015 | Greening | .......... H01M 10/0525 |
| 9,130,248 B2 | 9/2015 | Laskowsky et al. | |
| 2009/0259420 A1* | 10/2009 | Greening | .............. H01M 4/364 702/63 |
| 2010/0000809 A1* | 1/2010 | Nishi | ...................... B60K 6/445 180/65.29 |
| 2010/0148731 A1* | 6/2010 | Notten | .................. H02J 7/0072 320/162 |

(Continued)

OTHER PUBLICATIONS

Di Domenico, Domenico, et al., Lithium-Ion Battery State of Charge Estimation With a Kalman Filter Based on an Electrochemical Model, Conference Paper, DOI:10.1109/cca 2008.4629639, Oct. 2008, 7 pages.

(Continued)

*Primary Examiner* — Phallaka Kik
(74) *Attorney, Agent, or Firm* — David B. Kelley; Brooks Kushman P.C.

(57) ABSTRACT

A vehicle may include a battery having positive and negative electrodes. The vehicle may also include a controller programmed to charge and discharge the battery according to a state of charge that is based on an effective surface lithium-ion concentration of one of the electrodes, and an effective surface lithium-ion concentration of the other of the electrodes derived from a center-to-surface lithium-ion concentration profile of the one of the electrodes. The effective surface lithium-ion concentration of the other of the electrodes may be derived via a relationship mapping the center-to-surface lithium-ion concentration profile of the one of the electrodes to the effective surface lithium-ion concentration of the other of the electrodes.

12 Claims, 8 Drawing Sheets

(56) References Cited

U.S. PATENT DOCUMENTS

| | | | | |
|---|---|---|---|---|
| 2012/0301786 A1* | 11/2012 | Takamuku | ......... | B60L 11/1879 |
| | | | | 429/223 |
| 2013/0119921 A1* | 5/2013 | Choe | ....... | H02J 7/007 |
| | | | | 320/106 |
| 2013/0249498 A1* | 9/2013 | Yamamoto | ............. | H01M 2/24 |
| | | | | 320/137 |
| 2014/0072862 A1* | 3/2014 | Saito | ................ | H01M 10/0525 |
| | | | | 429/163 |
| 2014/0350877 A1 | 11/2014 | Chow et al. | | |
| 2015/0371788 A1* | 12/2015 | Okada | .................... | H01G 11/24 |
| | | | | 361/502 |
| 2016/0028080 A1* | 1/2016 | Sugiura | ................ | H01M 4/366 |
| | | | | 429/223 |
| 2016/0052419 A1* | 2/2016 | Takahashi | ............. | H01M 10/48 |
| | | | | 429/61 |
| 2016/0164093 A1* | 6/2016 | Inoue | .................... | C01G 53/50 |
| | | | | 429/223 |
| 2016/0233545 A1* | 8/2016 | Chen | ................. | H01M 10/0567 |
| 2017/0040616 A1* | 2/2017 | Lee | .................... | H01M 4/0402 |
| 2017/0133676 A1* | 5/2017 | Kodato | ................ | H01M 4/505 |
| 2017/0214103 A1* | 7/2017 | Onnerud | ............ | H01M 10/658 |
| 2017/0222225 A1* | 8/2017 | Kang | .................... | H01M 4/525 |
| | | | | 429/105 |

OTHER PUBLICATIONS

Nam, Oanyong, et al., Li-Ion Battery SOC Estimation Method Based on the Reduced Order Extended Kalman Filtering, American Institute of Aeronautics and Astronautics, Korea, Nov. 2007, 9 pages.

Malinowski, Kyle David, State of Charge Estimation for Advanced Batteries: Reduced Order Electrochemical Modeling With Error Compensation, A Thesis submitted to the Graduate Faculty of Auburn University, Auburn, Alabama, Dec. 12, 2011, 156 pages.

* cited by examiner

FIG. 4A                    FIG. 4B

Even Discretization    Uneven Discretization

BATTERY STATE OF CHARGE ESTIMATION BASED ON REDUCED ORDER ELECTROCHEMICAL MODELS

TECHNICAL FIELD

This application is generally related to battery state of charge estimation using reduced order battery models.

BACKGROUND

Hybrid-electric and pure electric vehicles rely on a traction battery to provide power for propulsion. The traction battery typically includes a number of battery cells connected in various configurations. To ensure optimal operation of the vehicle, various properties of the traction battery may be monitored. One useful property is the battery state of charge (SOC), which indicates the amount of charge stored in the battery. The SOC may be calculated for the traction battery as a whole and for each of the cells. The SOC of the traction battery provides an indication of the charge remaining. The SOC for each individual cell provides information that is useful for balancing the SOC between the cells. In addition to the SOC, battery allowable charging and discharging power limits can be used to determine the range of battery operation and to prevent battery excessive operation.

SUMMARY

A vehicle may include a battery having positive and negative electrodes. A controller may be programmed to charge and discharge the battery according to a state of charge (SOC). The SOC may be calculated from an effective lithium-ion concentration profile of one of the electrodes that is estimated by a closed-loop estimator based on an electrochemical battery model. The closed-loop estimator may be designed to estimate effective surface lithium-ion concentration of the positive electrode or negative electrode. An effective surface lithium-ion concentration of one of the electrodes may be calculated from an effective lithium-ion concentration profile of the other of the electrodes via a non-linear relationship mapping the center-to-surface lithium-ion concentration profile of the one of the electrodes to the effective surface lithium-ion concentration of the other of the electrodes.

BRIEF DESCRIPTION OF THE DRAWINGS

FIG. 4A is an illustration of Li-ion concentration profiles inside representative particles in the negative electrode resulting from the Li-ion diffusion process during discharging.

FIG. 4B is an illustration of Li-ion concentration profiles inside representative particles in the positive electrode resulting from the Li-ion diffusion process during discharging.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
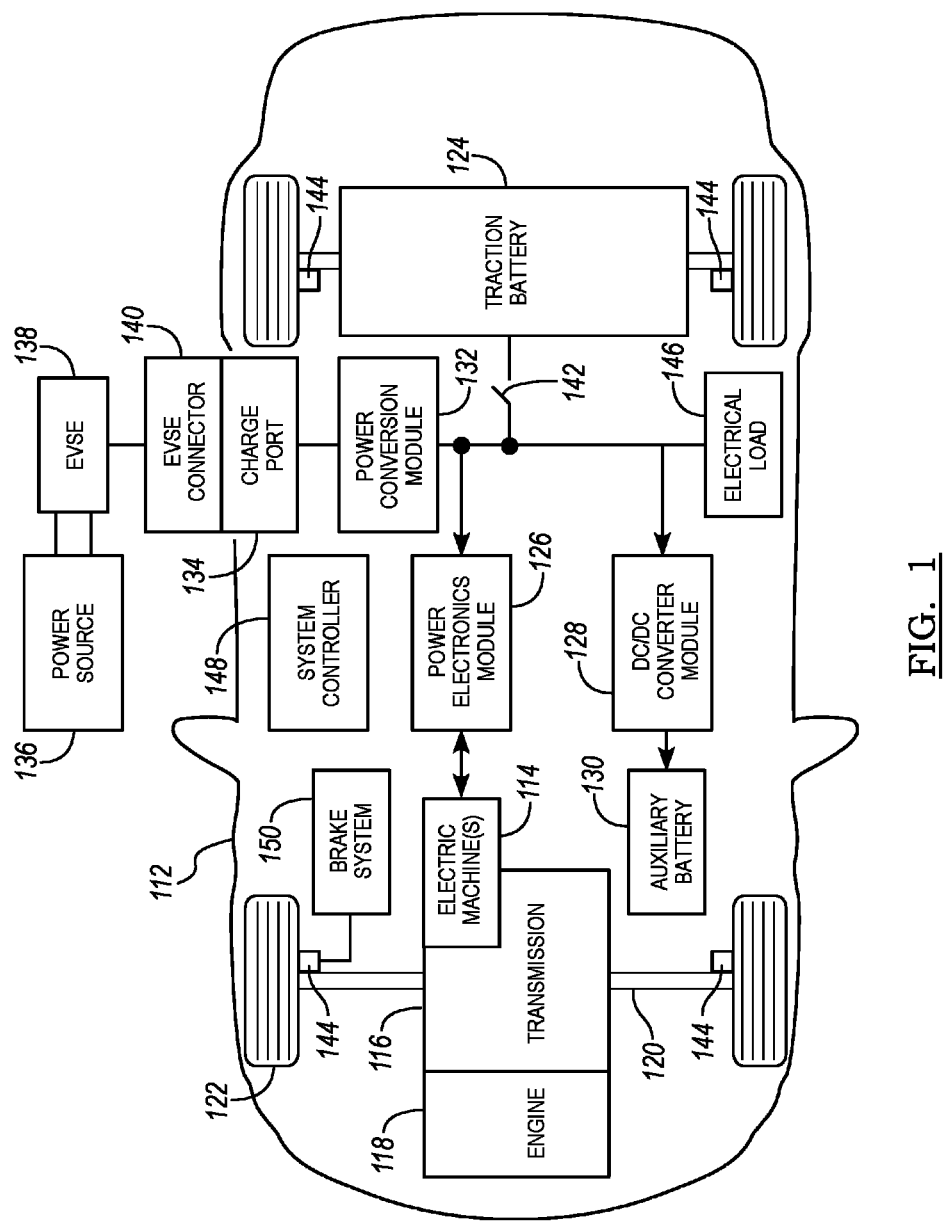
FIG. 1 is a diagram of a hybrid vehicle illustrating typical drivetrain and energy storage components.

FIG. 1 depicts a typical plug-in hybrid-electric vehicle (HEV). A typical plug-in hybrid-electric vehicle 112 may comprise one or more electric machines 114 coupled to a hybrid transmission 116. The electric machines 114 may be capable of operating as a motor or a generator. In addition, the hybrid transmission 116 is coupled to an engine 118. The hybrid transmission 116 is also coupled to a drive shaft 120 that is coupled to the wheels 122. The electric machines 114 can provide propulsion and deceleration capability when the engine 118 is turned on or off. The electric machines 114 also act as generators and can provide fuel economy benefits by recovering energy that would normally be lost as heat in the friction braking system. The electric machines 114 may also reduce vehicle emissions by allowing the engine 118 to operate at more efficient conditions (engine speeds and loads) and allowing the hybrid-electric vehicle 112 to be operated in electric mode with the engine 118 off under certain conditions.

A traction battery or battery pack 124 stores energy that can be used by the electric machines 114. A vehicle battery pack 124 typically provides a high voltage DC output. The traction battery 124 is electrically connected to one or more power electronics modules. One or more contactors 142 may isolate the traction battery 124 from other components when opened and connect the traction battery 124 to other components when closed. The power electronics module 126 is also electrically connected to the electric machines 114 and provides the ability to bi-directionally transfer energy between the traction battery 124 and the electric machines 114. For example, a typical traction battery 124 may provide a DC voltage while the electric machines 114 may use a three-phase AC current to function. The power electronics module 126 may convert the DC voltage to a three-phase AC current used by the electric machines 114. In a regenerative mode, the power electronics module 126 may convert the three-phase AC current from the electric machines 114 acting as generators to the DC voltage used by the traction battery 124. The description herein is equally applicable to a pure electric vehicle. For a pure electric vehicle, the hybrid transmission 116 may be a gear box connected to an electric machine 114 and the engine 118 may not be present.

In addition to providing energy for propulsion, the traction battery 124 may provide energy for other vehicle electrical systems. A vehicle may include a DC/DC converter module 128 that converts the high voltage DC output of the traction battery 124 to a low voltage DC supply that is compatible with other vehicle loads. Other high-voltage electrical loads 146, such as compressors and electric heaters, may be connected directly to the high-voltage without the use of a DC/DC converter module 128. The electrical loads 146 may have an associated controller that operates the electrical load 146 when appropriate. The low-voltage systems may be electrically connected to an auxiliary battery 130 (e.g., 12V battery).

The vehicle 112 may be an electric vehicle or a plug-in hybrid vehicle in which the traction battery 124 may be recharged by an external power source 136. The external power source 136 may be a connection to an electrical outlet. The external power source 136 may be electrically connected to electric vehicle supply equipment (EVSE) 138. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically connected to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components that work cooperatively to operate the wheel brakes 144. For simplicity, the figure depicts one connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 to decelerate or control the vehicle. The brake system 150 may respond to driver commands and may also operate autonomously to implement features such as stability control. The controller of the brake system 150 may implement a method of applying a requested brake force when requested by another controller or sub-function.

The various components discussed may have one or more associated controllers to control and monitor the operation of the components. The controllers may communicate via a serial bus (e.g., Controller Area Network (CAN)) or via discrete conductors. In addition, a system controller 148 may be present to coordinate the operation of the various components. A traction battery 124 may be constructed from a variety of chemical formulations. Typical battery pack chemistries may be lead acid, nickel-metal hydride (NIMH) or Lithium-Ion.

Figure 2:
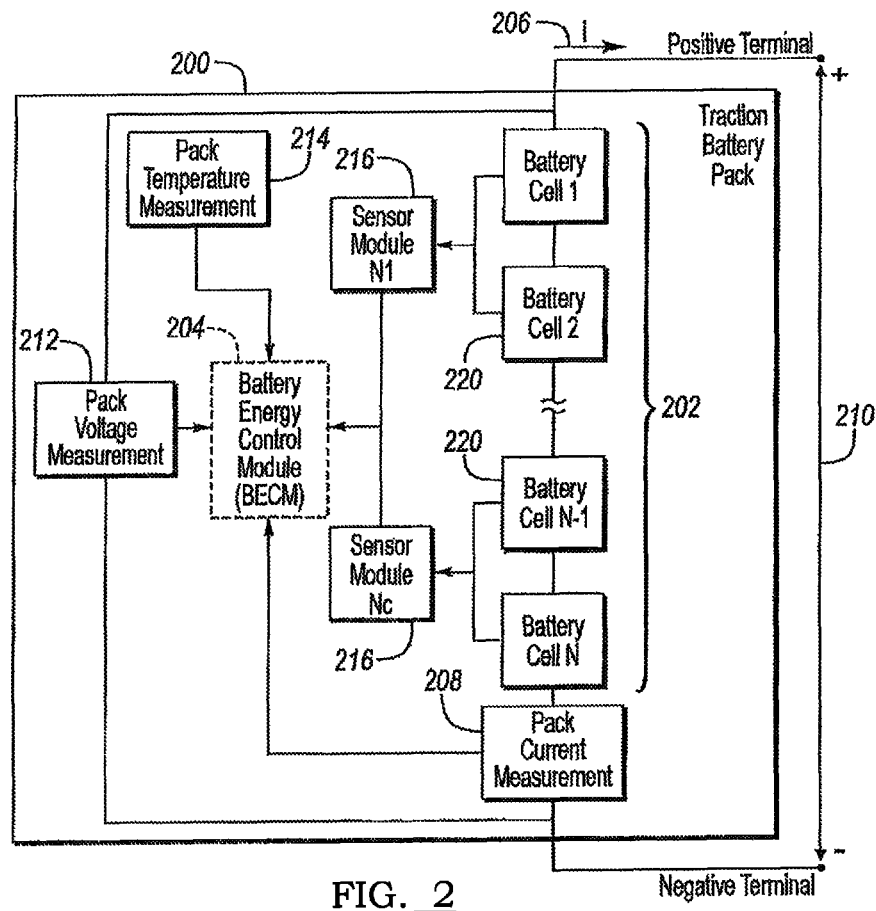
FIG. 2 is a diagram of a possible battery pack arrangement comprised of multiple cells, and monitored and controlled by a Battery Energy Control Module.

FIG. 2 shows a typical traction battery pack 200 in a simple series configuration of N battery cells 202. Battery packs 200, may be composed of any number of individual battery cells connected in series or parallel or some combination thereof. A typical system may have a one or more controllers, such as a Battery Energy Control Module (BECM) 204 that monitors and controls the performance of the traction battery 200. The BECM 204 may monitor several battery pack level characteristics such as pack current 206 that may be monitored by a pack current measurement module 208, pack voltage 210 that may be monitored by a pack voltage measurement module 212 and pack temperature that may be monitored by a pack temperature measurement module 214. The BECM 204 may have non-volatile memory such that data may be retained when the BECM 204 is in an off condition. Retained data may be available upon the next ignition cycle. A battery management system may be comprised of the components other than the battery cells and may include the BECM 204, measurement sensors and modules (208, 212, 214), and sensor modules 216. The function of the battery management system may be to operate the traction battery in a safe and efficient manner.

In addition to the pack level characteristics, there may be battery cell 220 level characteristics that are measured and monitored. For example, the voltage, current, and temperature of each cell 220 may be measured. A system may use a sensor module 216 to measure the characteristics of individual battery cells 220. Depending on the capabilities, the sensor module 216 may measure the characteristics of one or multiple of the battery cells 220. The battery pack 200 may utilize up to $N_c$ sensor modules 216 to measure the characteristics of each of the battery cells 220. Each sensor module 216 may transfer the measurements to the BECM 204 for further processing and coordination. The sensor module 216 may transfer signals in analog or digital form to the BECM 204. In some embodiments, the functionality of the sensor module 216 may be incorporated internally to the BECM 204. That is, the sensor module 216 hardware may be integrated as part of the circuitry in the BECM 204 wherein the BECM 204 may handle the processing of raw signals.

The battery cell 200 and pack voltages 210 may be measured using a circuit in the pack voltage measurement module 212. The voltage sensor circuit within the sensor module 216 and pack voltage measurement circuitry 212 may contain various electrical components to scale and sample the voltage signal. The measurement signals may be routed to inputs of an analog-to-digital (A/D) converter within the sensor module 216, the sensor module 216 and BECM 204 for conversion to a digital value. These components may become shorted or opened causing the voltage to be measured improperly. Additionally, these problems may occur intermittently over time and appear in the measured voltage data. The sensor module 216, pack voltage sensor 212 and BECM 204 may contain circuitry to ascertain the status of the voltage measurement components. In addition, a controller within the sensor module 216 or the BECM 204 may perform signal boundary checks based on expected signal operating levels.

Figure 3:
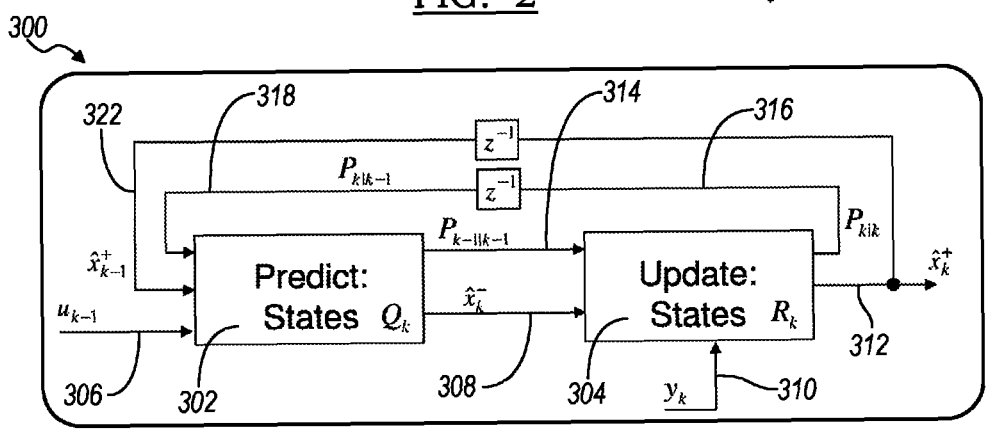
FIG. 3 is a diagram of a closed-loop state-based control framework in a Kalman filter system.

FIG. 3 is an illustration of a (Extended) Kalman Filter 300 used with a reduced order electrochemical model. Feedback loops are used to estimate system state while minimizing process and measurement noises existent in a real system. Predict state 302 feeds update state 304 with predicted values $\hat{x}_k^-$ 308, which is calculated based on the control input and estimated states at the previous time step and measured voltage output, $y_k$ 310, which is the measurement signal at the present time step, and feedback values $P_{k-1|k-1}$ 314, which is the covariance of the estimated error of states at the previous time step. The predict state 302 is fed with control signal or current input $u_{k-1}$ 306 at the previous time step, feedback predicted value $\hat{x}_{k-1}^-$ 322 at the previous time step, and feedback value $P_{k-1}$ 318. Update state 304 outputs predicted value $\hat{x}_k^+$, and $P_k$.

Figure 4:
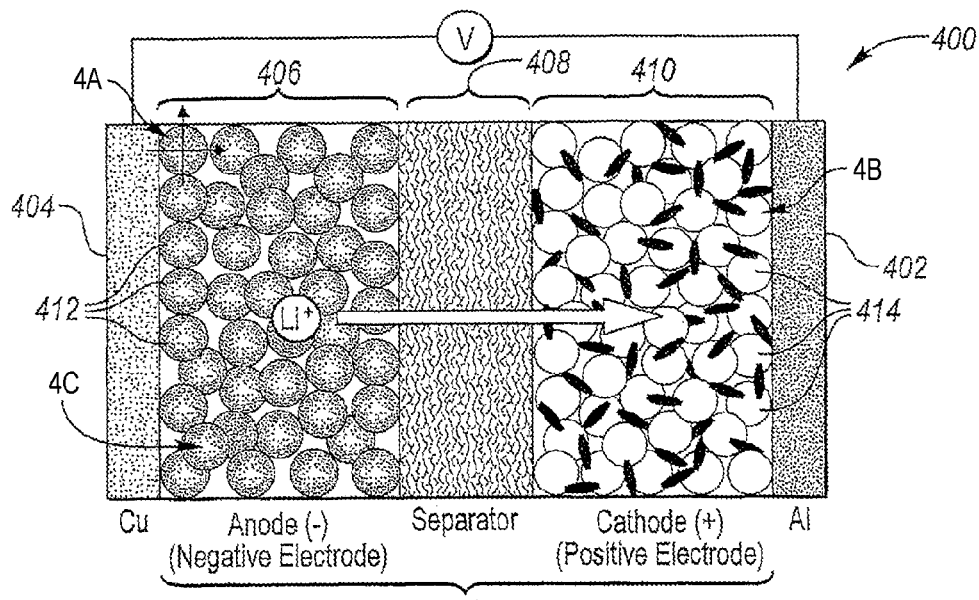
FIG. 4 is an illustration of a cross section of a metal-ion battery with porous electrodes.

An example electrochemical method is disclosed. FIG. 4 is an illustration of the cross section of the laminated structure of a Metal-ion battery cell 400 or cell. This Metal-ion battery cell 400 may be a Li-ion battery cell. The laminated structure may be configured as a prismatic cell, a cylindrical cell or other cell structure with respect to various packaging methods. The cell geometry or physical structure may be different (e.g. cylindrical, rectangular, etc.), but the basic structure of the cell is the same. Generally, the Metal-ion cell 400, for example a Li-ion battery, includes a positive current collector 402 which is typically aluminum, but may be another suitable material or alloy, a negative current collector 404 which is typically copper, but may be another suitable material or alloy, a negative electrode 406 which is typically carbon, graphite or graphene, but may be another suitable material, a separator 408, and a positive electrode 410 which is typically a metal oxide (e.g. lithium cobalt oxide (LiCoO$_2$), Lithium iron phosphate (LiFePO$_4$), lithium manganese oxide (LMnO$_2$), Nickel Manganese Cobalt Oxide (NMC), Nickel Manganese Cobalt Oxide (NMC)), but may be another suitable material. Each electrode (406, 410) may have a porous structure increasing the surface area of each electrode, in which Metal-ions (e.g. Li-ions) travel across the electrode though the electrolyte and diffuse into/out of electrode solid particles (412, 414).

There are multiple ranges of time scales existent in electrochemical dynamic responses of a Metal-ion battery 400. For example with a Li-ion battery, factors which impact the dynamics include but are not limited to the electrochemical reaction in active solid particles 412 in the electrodes and the mass transport of Lithium-ion across the electrodes 416. When considering these aspects, the basic reaction in the electrodes may be expressed as

$$\Theta + Li + + e - \leftrightarrows = \Theta - Li \qquad (1)$$

In which $\Theta$ is the available site for intercalation, $Li^+$ is the Li-ion, $e^-$ is the electron, and $\Theta$–Li is the intercalated Lithium in the solid solution.

Figure 4C:
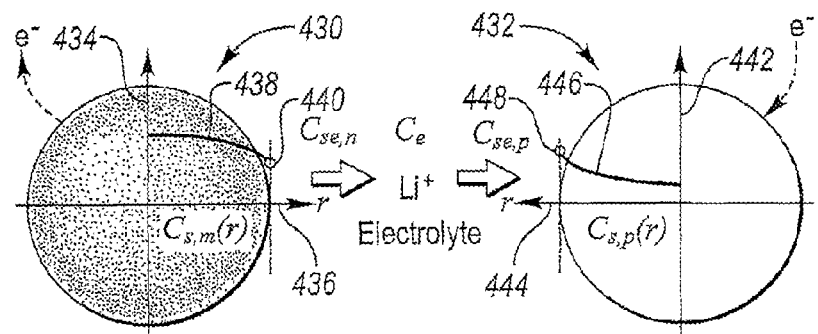
FIG. 4C is an illustration of an active material solid particle and Li-ion transfer and diffusion processes.
Figure 4C:
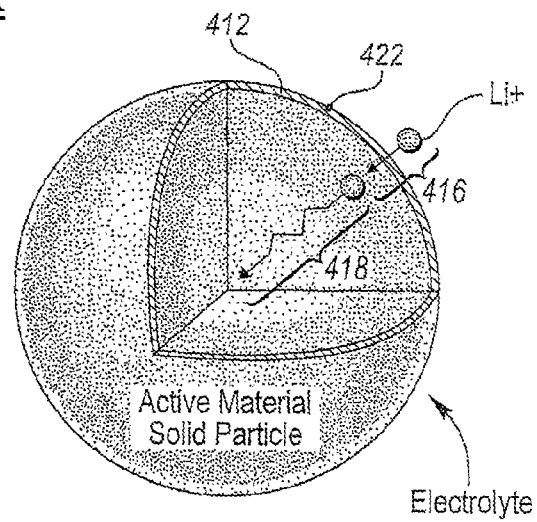

This fundamental reaction expressed by equation (1) is governed by multiple time scale processes. This is shown in FIG. 4C, in which the categories of the processes include charge transfer 416, diffusion 418, and polarization 420. These terms differ from the definitions used by the electrochemical society to facilitate a reduced-order electrochemical battery model derivation. Here, the charge transfer process 416 represents the Metal-ion exchange behavior across the solid-electrolyte interface (SEI) 422 at each active solid particle (412, 414). The charge transfer process is fast (e.g. less than, but not limited to, 100 milliseconds) under most cases and directly affected by the reaction rate at each electrode (406 & 410). There are multiple frequency components for the charge transfer, the charge transfer consists of both fast and slow dynamics, or in other words the charge transfer has frequency components less and greater than a predetermined frequency. The diffusion process 418 represents the Metal-ion transfer from the surface to the center of the solid particle or vice versa. The diffusion process is slow (e.g. greater than, but not limited to, 1 second) and is determined by the size and material of active solid particle (412, 414), and the Metal-ion intercalation level. There are multiple frequency components for the diffusion process, the diffusion process consists of both fast and slow dynamics, or in other words the diffusion process has frequency components less and greater than a predetermined frequency. The polarization 420 process includes all other conditions having inhomogeneous Metal-ion concentrations in the electrolyte or electrode in space. The polarization 420 caused by the charge transfer 416 and the diffusion 418 is not included in this categorization. There are multiple frequency components for the polarization, the polarization consists of both fast and slow dynamics, or in other words the polarization has frequency components less and greater than a predetermined frequency.

The anode 406 and cathode 410 may be modeled as a spherical material (i.e. spherical electrode material model) as illustrated by the anode spherical material 430 and the cathode spherical material 432. However other model structures may be used. The anode spherical material 430 has a metal-ion concentration 434 which is shown in relation to the radius of the sphere 436. The concentration of the Metal-ion 438 changes as a function of the radius 436 with a metal-ion concentration at the surface to electrolyte interface of 440. Similarly, the cathode spherical material 432 has a metal-ion concentration 442 which is shown in relation to the radius of the sphere 444. The concentration of the Metal-ion 446 changes as a function of the radius 444 with a metal-ion concentration at the surface to electrolyte interface of 448.

The full-order electrochemical model of a Metal-ion battery 400 is the basis of a reduced-order electrochemical model. The full-order electrochemical model resolves Metal-ion concentration through the electrode thickness (406 & 410) and assumes the Metal-ion concentration is homogeneous throughout the other coordinates. This model accurately captures the key electrochemical dynamics. The model describes the electric potential changes and the ionic mass transfer in the electrode and the electrolyte by four partial differential equations non-linearly coupled through the Butler-Volmer current density equation.

The model equations include Ohm's law for the electronically conducting solid phase which is expressed by equation (2), $$\vec{\nabla}_x \sigma^{eff} \vec{\nabla}_x \phi_s = +j^{Li}, \quad (2)$$

Ohm's law for the ion-conducting liquid phase is expressed by equation (3), $$\vec{\nabla}_x \kappa^{eff} \vec{\nabla}_x \phi_e + \vec{\nabla}_x \kappa_D^{eff} \vec{\nabla}_x \ln c_e = -j^{Li}, \quad (3)$$

Fick's law of diffusion is expressed by equation (4), $$\frac{\partial c_s}{\partial t} = \vec{\nabla}_r (D_s \vec{\nabla}_r c_s), \quad (4)$$

Material balance in the electrolyte is expressed by equation (5), $$\frac{\partial \varepsilon_e c_e}{\partial t} = \vec{\nabla}_x (D_e^{eff} \vec{\nabla}_x c_e) + \frac{1-t^0}{F} j^{Li}, \quad (5)$$

Butler-Volmer current density is expressed by equation (6), $$j^{Li} = a_s j_0 \left[ \exp\left(\frac{\alpha_a F}{RT}\eta\right) - \exp\left(-\frac{\alpha_c F}{RT}\eta\right) \right], \quad (6)$$

in which $\phi$ is the electric potential, c is the Metal-ion concentration, subscript s and e represent the active electrode solid particle and the electrolyte respectively, $\sigma^{eff}$ is the effective electrical conductivity of the electrode, $\kappa^{eff}$ is the effective electrical conductivity of the electrolyte, $\kappa_D^{eff}$ is the liquid junction potential term, $D_s$ is the diffusion coefficient of Metal-ion in the electrode, $D_e^{eff}$ is the effective diffusion coefficient of Metal-ion in the electrolyte, $t^0$ is the transference number, F is the Faraday constant, $\alpha_a$ is the transfer coefficient for anodic reaction, $\alpha_s$ is the transfer coefficient for cathodic reaction, R is the gas constant, T is the temperature, $\eta = \phi_s - \phi_e - U(c_{se})$ is the over potential at the solid-electrolyte interface at an active solid particle, and $j_0 = k(c_e)^{\alpha_a}(c_{s,max} - c_{se})^{\alpha_a}(c_{se})^{\alpha_c}$.

Fast and slow dynamic responses were evaluated and validated by comparing the dynamic responses to test data under the same test conditions, for example, a dynamic response under a ten second discharging pulse are computed using a full-order battery model to investigate the battery dynamic responses.

Figure 5:
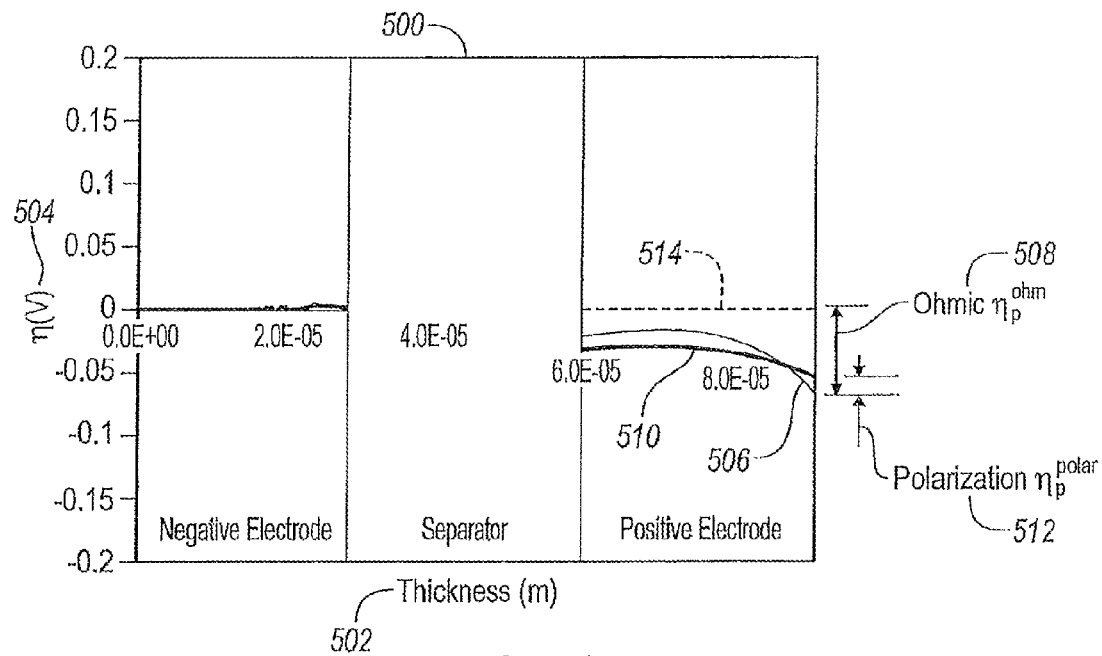
FIG. 5 is a graph of the over-potential in relation to the cell thickness in response to a 10 second current impulse input.

The analysis of the dynamic responses includes the diffusion overpotential difference and the electric potential difference of the electrolyte. FIG. 5 is a graphical representation of the change in overpotential with respect to distance on an axis, in this example, the radius of the spherical battery model. Here, the overpotential difference between the current collectors 500 is expressed as $\eta_p|_{x=L} - \eta_n|_{x=0}$. The x-axis represents the electrode thickness 502, and the y-axis represents the overpotential 504. At the positive current collector when a 10 sec current pulse is applied, the instantaneous voltage drop is observed. At zero seconds 506, the voltage is influenced by the Ohmic term 508. As time increases, as shown at 5 seconds 510, the voltage is additional influenced by the polarization term 512 wherein the voltage is influenced by both the Ohmic and the polarization term, until the voltage influence reaches steady state as shown at time 100 seconds 514. The voltage drop at the positive current collector is slightly changing while input current is applied. Two dominant time scales, instantaneous and medium-to-slow, are observed in the over potential difference responses.

Figure 6:
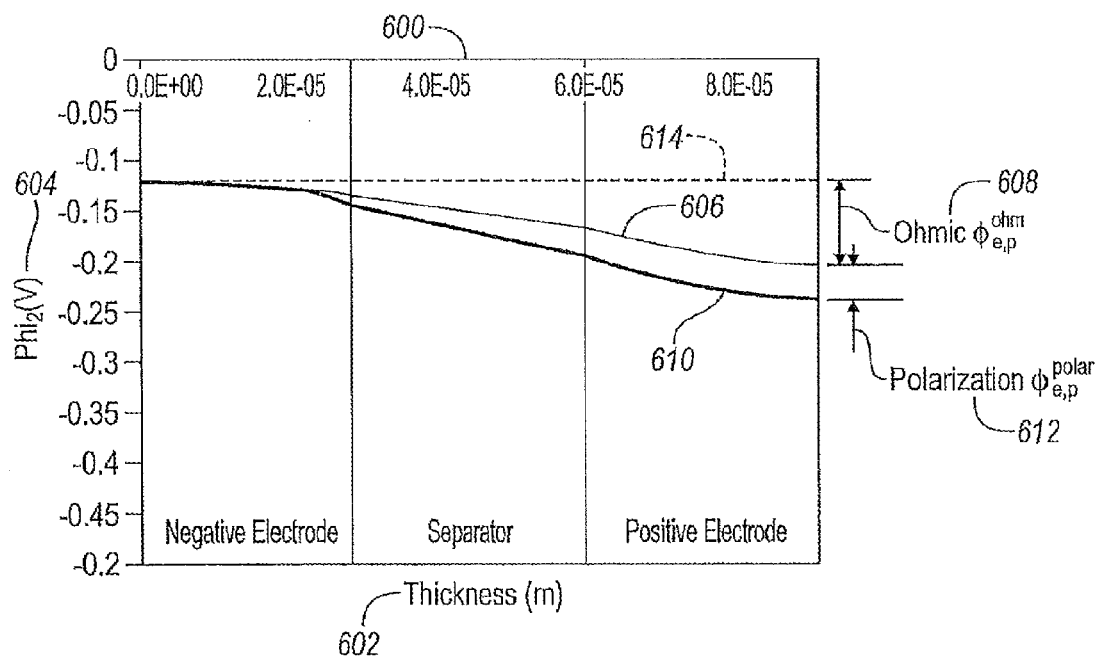
FIG. 6 is a graph of the voltage drop in the electrolyte in relation to the cell thickness in response to a 10 second current impulse input.

FIG. 6 is a graphical representation of the change in electrolyte electrical potential (electrical potential) with respect to distance on an axis, in this example, the radius of the spherical battery model. The electrolyte electrical potential difference of the electrolyte between the current collectors 600, expressed as $\phi_e|_{x=L} - \phi_e|_{x=0}$, is shown in FIG. 6. The x-axis represents the electrode thickness 602, and the y-axis represents the electrical potential 604. There is an instantaneous voltage drop at zero second 606. The instantaneous voltage drop is mainly governed by the electrical conductivity of the electrolyte 608. The voltage change after the initial drop, as shown at 5 seconds 610, is governed by Metal-ion transport across the electrodes 612. The steady state potential is shown at 100 seconds 614. The electrochemical dynamics, such as local open circuit potential, over potential and electrolyte potential, include both instantaneous-to-fast dynamics and slow-to-medium dynamics.

The use of the full-order dynamics in a real-time control system is computationally difficult and expensive using modern microprocessors and microcontrollers. To reduce complexity and maintain accuracy, a reduced-order electrochemical battery model should maintain data relevant to physical information throughout the model reduction procedure. A reduced-order model for battery controls in electrified vehicles should be valid under a wide range of battery operation to maintain operational accuracy. The model structure may be manipulated to a state-space form for control design implementation. Although significant research has been conducted to develop reduced-order electrochemical battery models, an accurate model has previously not been available for use in a vehicle control system. For example, single particle models typically are only valid under low current operating conditions due to the assumption of uniform Metal-ion concentration along the electrode thickness. Other approaches (relying on model coordinate transform to predict terminal voltage responses) lose physically relevant information of the electrochemical process.

A new approach is disclosed to overcome aforementioned limitations of previous approaches. This newly disclosed model reduction procedure is designed: (1) to capture broad time scale responses of the electrochemical process; (2) to maintain physically relevant state variables; and (3) to be formulated in a state-space form.

The reduction procedure starts from the categorization of electrochemical dynamic responses in a cell. The electrochemical dynamics are divided into "Ohmic" or instantaneous dynamics 506 and 606, and "Polarization" or slow-to-medium dynamics 510 and 610. The battery terminal voltage may be expressed by equation (7), $$V = \phi_s|_{x=L} \phi_s|_{x=0}, \quad (7)$$

the over potential at each electrode may be expressed by equation (8), $$\eta_i = \phi_{s,i} - \phi_{e,i} - U_i(\theta_i), \quad (8)$$

in which $U_i(\theta_i)$ is the open-circuit potential of electrode as a function of a normalized metal-ion concentration. From eqns. (7) and (8), the terminal voltage may be expressed by equation (9), $$V = (U_p(\theta_p)|_{x=L} + \phi_e|_{x=L} + \eta_p|_{x=L}) - (U_n(\theta_n)|_{x=0} + \phi_e|_{x=0} + \eta_n|_{x=0}) \quad (9)$$

$$= U_p(\theta_p)|_{x=L} - U_n(\theta_n)|_{x=0} + \eta_p|_{x=L} - \eta_n|_{x=0} + \phi_e|_{x=L} - \phi_e|_{x=0}.$$

The battery terminal voltage in eqn. (9) includes the open-circuit potential difference between the current collectors which may be expressed as $(U_p(\theta_p)|_{x=L} - U_n(\theta_n)|_{x=0})$, the over potential difference between the current collectors which may be expressed as $(\eta_p|_{x=L} - \eta_n|_{x=0})$, and the electrolyte electrical potential difference between the current collectors which may be expressed as $(\phi_e|_{x=L} - \phi_e|_{x=0})$ The terminal voltage may be reduced to equation (10), $$V = U_p(\theta_p)|_{x=L} - U_n(\theta_n)|_{x=0} + \eta_p|_{x=L} - \eta_n|_{x=0} + \phi_e|_{x=L} - \phi_e|_{x=0} \quad (10)$$

$$= U_p(\theta_p)|_{x=L} - U_n(\theta_n)|_{x=0} + \Delta\eta + \Delta\phi_e.$$

Figure 7:
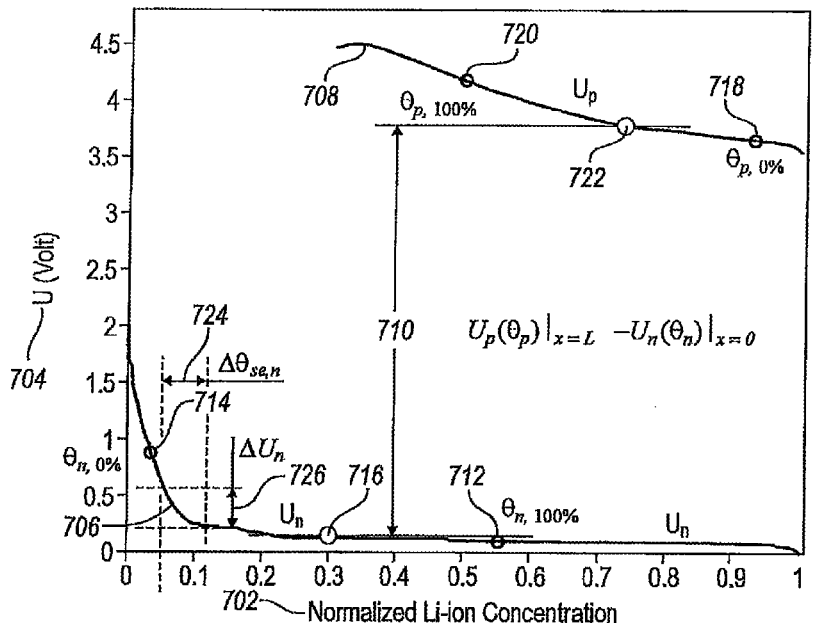
FIG. 7 is a graph illustrating an open circuit potential curve at the positive electrode and negative electrode in relation to the normalized ion concentration for the anode and cathode of an electro-chemical battery.

FIG. 7 illustrates a graphical representation of the surface potentials of the active solid particles at the current collectors 700. The x-axis represents the normalized metal-ion concentration 702, and the y-axis represents the electrical potential 704. The surface potential of the anode 706 may be expressed by $U_n(\theta_n)|_{x=0}$ and the surface potential of the cathode 708 may be expressed by $U_p(\theta_p)|_{x=L}$. The x-axis represents the normalized Metal-ion concentration 706, and the y-axis represents the surface potential in volts 708. The difference of surface potential 710 may be expressed by $U_p(\theta_p)|_{x=L} - U_n(\theta_n)|_{x=0}$ in which the normalized Metal-ion concentration in each electrode is expressed as $\theta_{s,p} = c_{s,p}^{eff}/c_{s,p,max}$ and $\theta_{s,n}^{eff} = c_{s,n}^{eff}/c_{s,n,max}$ respectively. The normalized metal-ion concentration of the anode when the battery state of charge is at 100% is shown at point 712 and the normalized metal-ion concentration of the anode when the battery state of charge is at 0% is shown at point 714, with an operating point at a moment in time being shown as 716, as an example. Similarly, the normalized metal-ion concentration of the cathode when the battery state of charge is at 100% is shown at point 720 and the normalized metal-ion concentration of the cathode when the battery state of charge is at 0% is shown at point 718, with an operating point at the moment in time being shown as 722, as an example. Viewing a change of concentration along the anode 706 and cathode 708, as the SOC increases, the anode operating point at a moment in time 716 moves from left to right, and the cathode operating point at the moment in time 722 moves from right to left. Due to many factors including chemistry and composition, the current operating point of the cathode 722 can be expressed as a function of the current operating point of the normalized anode concentration 716 and battery SOC. Similarly, the current operating point of the anode 716 can be expressed as a function of the current operating point of the normalized cathode concentration 722 and battery SOC.

The normalized Metal-ion concentration θ is mainly governed by the diffusion dynamics and slow dynamics across the electrodes. Resolving $\Delta\eta$ and $\Delta\phi$ from equation (10) into "Ohmic" and "Polarization" terms is expressed by equations (11) and (12), $$\Delta\eta = \Delta\eta^{Ohm} + \Delta\eta^{polar}, \quad (11)$$

$$\Delta\phi_e = \Delta\phi_e^{Ohm} + \Delta\phi_e^{polar}. \quad (12)$$

The "Ohmic" terms include instantaneous and fast dynamics, the "Polarization" terms include medium to slow dynamics. The terminal voltage of equation (10) may then be expressed as equation (13), $$V = U_p(\theta_p)|_{x=L} - U_n(\theta_n)|_{x=0} + \Delta\eta^{polar} + \Delta\phi_e^{polar} + \Delta\eta^{Ohm} + \Delta\phi_e^{Ohm} \quad (13)$$

Equation (13) represents the battery terminal voltage response without loss of any frequency response component. The first four components of equation (13) are related to the slow-to-medium dynamics, including diffusion and polarization. The slow-to-medium dynamics are represented as "augmented diffusion term". The last two components of equation (13) represent the instantaneous and fast dynamics. The instantaneous and fast dynamics are represented as "Ohmic term".

The augmented diffusion term may be modeled using a diffusion equation to maintain physically relevant state variables.

$$\frac{\partial c_s^{eff}}{\partial t} = \vec{\nabla}_r \left( D_s^{eff} \vec{\nabla}_r c_s^{eff} \right), \quad (14)$$

in which $c_s^{eff}$ is the effective Metal-ion concentration accounting for all slow-to-medium dynamics terms, and $D_s^{eff}$ is the effective diffusion coefficient accounting for all slow-to-medium dynamics terms. The boundary conditions for equation (14) are determined as $$\left. \frac{\partial c_s^{eff}}{\partial r} \right|_{r=0} = 0, \quad (15a)$$

$$\left. \frac{\partial c_s^{eff}}{\partial r} \right|_{r=R_s} = -\frac{I}{\delta A F a_s D_s^{eff}}, \quad (15b)$$

in which A is the electrode surface area, δ is the electrode thickness, $R_s$ is the active solid particle radius, and $$a_s = \frac{3\varepsilon_s}{R_s},$$

in which $\varepsilon_s$ is the porosity of the electrode. The Ohmic term is modeled as $$-R_0^{eff} I, \quad (16)$$

in which $R_0^{eff}$ is the effective Ohmic resistance accounting for all instantaneous and fast dynamics terms, and I is the battery current. $R_0^{eff}$ is obtained by deriving the partial differential equation (13) with respect to the battery current I and expressed as $$R_0^{eff} = -\left( \frac{\partial \Delta\eta^{Ohm}}{\partial I} + \frac{\partial \Delta\phi_e^{Ohm}}{\partial I} \right). \quad (17)$$

The effective Ohmic resistance can be modeled based on equation (17), or can be determined from test data.

The terminal voltage may then be expressed as $$V = U_p(\theta_{se,p}) - U_n(\theta_{se,n}) - R_0^{eff} I, \quad (18)$$

in which the normalized Metal-ion concentration at the solid/electrolyte interface of the cathode is $\theta_{se,p} = c_{se,p}^{eff}/c_{s,p,max}$, the normalized Metal-ion concentration at the solid/electrolyte interface of the anode is $\theta_{se,n} = c_{se,n}^{eff}/c_{s,n,max}$, $c_{s,p,max}$ is the maximum Metal-ion concentration at the positive electrode, $c_{s,n,max}$ is the maximum Metal-ion concentration at the negative electrode, and $c_{se}^{eff}$ is the effective Metal-ion concentration at the solid-electrolyte interface.

Equation (18) may be expressed as three model parameters, the anode effective diffusion coefficients ($D_{s,n}^{eff}$), the cathode effective diffusion coefficients ($D_{s,p}^{eff}$), effective internal resistance of both the anode and cathode ($R_0^{eff}$), and one state vector, the effective Metal-ion concentration ($c_s^{eff}$). The state vector effective Metal-ion concentration ($c_s^{eff}$) includes the anode state vector effective Metal-ion concentration ($c_{s,n}^{eff}$), which may be governed by the anode effective diffusion coefficients ($D_{s,n}^{eff}$), and cathode state vector effective Metal-ion concentration ($c_{s,p}^{eff}$), which may be governed by the cathode effective diffusion coefficients ($D_{s,p}^{eff}$) based on the application of equation (14). The parameters may be expressed as functions of, but not limited to, temperature, SOC, battery life, battery health and number of charge cycles applied. The parameters ($D_{s,n}^{eff}$, $D_{s,p}^{eff}$, $R_0^{eff}$) may be determined by modeling, experimentation, calibration or other means.

Referring back to FIG. 7, the normalized Metal-ion concentration at the solid/electrolyte interface of the anode $\theta_{se,n}$ may be expressed as a function of the normalized Metal-ion concentration at the solid/electrolyte interface of the cathode $\theta_{se,p}$ and the battery state of charge $SOC_{ave}$. An example of the augmented diffusion dynamics, as the Metal-ion concentration of the cathode at the current collector increases along the normalized Metal-ion concentration line 708 (e.g. from 0.7 to 0.8), the Metal-ion concentration of the anode at the current collector will correspondingly decreases along the normalized Metal-ion concentration line 706. The corresponding decrease of the anode will be a function of the increase of the cathode, but may not be equal to the amount increased in the cathode. This functional relationship allows the status or operation of one electrode (i.e. a representative electrode) to provide information to determine the status or operation of the other electrode. A change of the open circuit voltage of the anode ($\Delta U_n$) 726 corresponds to a change in the normalized metal-ion concentration at the surface to electrolyte interface ($\Delta\theta_{se,n}$) 724.

If the metal-ion concentration of the anode is expressed by $\theta_{se,n} = f(c_{se,p}, SOC_{ave})$ to relate the metal-ion dynamics at the cathode to the metal-ion dynamics at the anode, the dynamic responses of the anode may be calculated from the dynamic response of the cathode. The terminal voltage may then be expressed from eqn. (18) as $$V = U_p(\theta_{se,p}) - U_n(f(c_{se,p}, SOC_{ave})) - R_0^{eff} I, \quad (19)$$

where $$\theta_{se} = \theta_{0\%} + SOC_{se}(\theta_{100\%} - \theta_{0\%}) \quad (20)$$

$f(c_{se,p}, SOC_{ave})$ in the second term in eqn. (19) may be calculated by $$\theta_{se,n} = f(c_{p,se}^{eff}, SOC_{ave}) = w_1 c_{p,se}^{eff} + w_2 SOC_{ave} \quad (21)$$

$c_{se,p}$ and $SOC_{ave}$ is defined by $$c_{se,p} = G_1(c_s^{eff}) \quad (22)$$

$$SOC_{ave} = G_2(c_s^{eff}) \quad (23)$$

where $G_1$ is a function to map $c_s^{eff}$ to $c_{se,p}$ and $G_2$ is a function to map $c_s^{eff}$ to $SOC_{ave}$, and, the weight $w_1 = (SOC_{ave})^m$ in which m may be an exponent to tune the response and the weight $w_2 = 1 - w_1$.

By combining eqns. (22) and (23), eqn. (21) becomes $$f(c_{p,se}^{eff}, SOC_{ave}) = w_1 G_1(c_s^{eff}) + w_2 G_2(c_s^{eff}) \quad (24)$$

Then, equation (19) is expressed as $$V = U_p(\theta_{se,p}) - U_n(w_1 G_1(c_s^{eff}) + w_2 G_2(c_s^{eff})) - R_0^{eff} I \quad (25)$$

Figure 8:
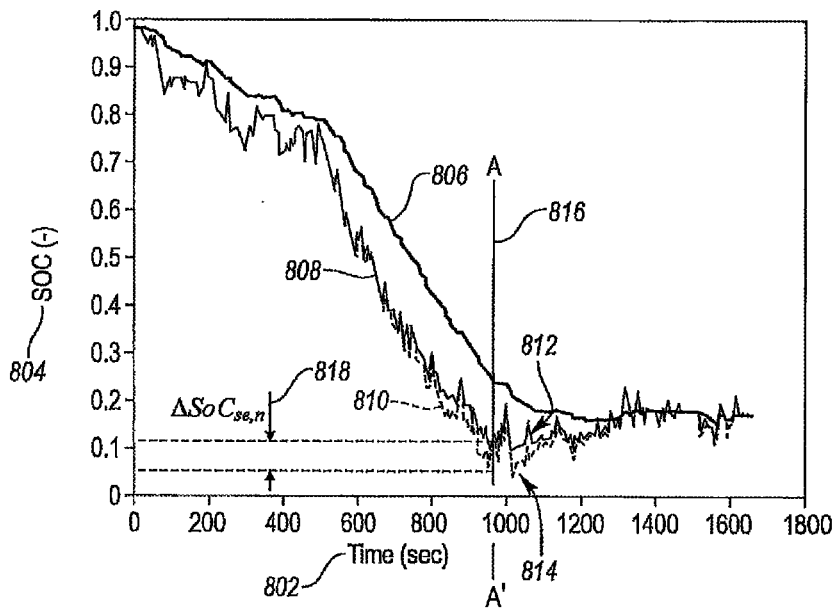
FIG. 8 is a graph illustrating battery state of charge (SOC) and estimated Li-ion concentration profiles at representative electrode particles at the positive electrode and the negative electrode in relation to time.
Figure 9:
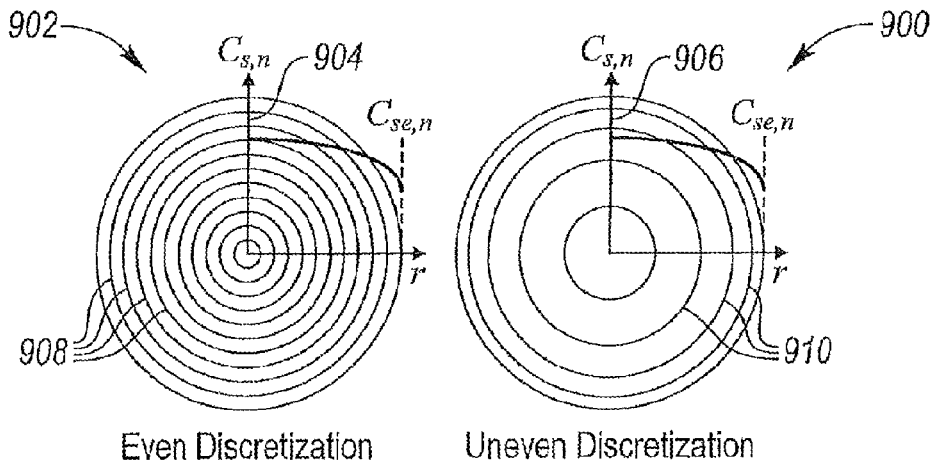
FIG. 9 is an illustration and graph of the ion concentration of an even discretization and an uneven discretization along the radius of an active material particle.

Equation (25) is now a function of $c_s^{eff}$ with the definition of $\theta_{se,p} = c_{se,p}^{eff}/c_{s,p,max}$ FIG. 8 is a graphical illustration of the battery state of charge (SOC) 804 in relation to time 802. This graphical illustration shows the average battery state of charge 806, the battery state of charge at the solid to electrolyte interface of the cathode 808 and the battery state of charge at the solid to electrolyte interface of the anode 810. A computed electrochemical dynamic from the model at one electrode 814, for example the cathode, allows predicted electrochemical dynamics of the other electrode 812, based on equations (19), (20), and (21).

Using equations (19), (20), and (21), different electrochemical dynamics between electrodes are captured, and the difference results in $\Delta SOC_{se,n}$ along the line A-A' 816. In other words, the dynamics difference between the electrodes and resulting the difference in battery state of charge ($\Delta SOC_{se,n}$) 818 are captured by the proposed methodology. The difference of the normalized Li-ion concentration at the negative electrode can be computed from $\Delta SOC_{se,n}$ 818, and the difference results in $\Delta U_n$ in 726. Thus, the terminal voltage in equation (19) is computed.

Further model reduction may be possible by reducing the number of discretization using uneven discretization. The objectives of uneven discretization are to achieve a compact model structure while maintaining the model accuracy. Thus, the uneven discretization may produce a more compact battery model form and lower the required processor bandwidth. Other model reduction approaches could capture similar battery dynamics. However, the uneven discretization can maintain physically meaningful states to represent Metal-ion diffusion dynamics.

Equation (14) is expressed as a set of ordinary differential equations (ODE) by using the finite difference method for the spatial variable r in order to be used as the battery control-oriented model. The derived state-space equations using uneven discretization are $$\dot{c}_s^{eff} = A c_s^{eff} + Bu \quad (26)$$

$$Y = h(c_s^{eff}) = U_p(\theta_{se,p}) - U_n(\theta_{se,n}) \quad (27)$$

where $c_s^{eff}$ is the effective Li-ion concentration n-by-1 vector accounting for the slow-to-medium dynamics terms, A is the n-by-n system matrix that characterizes the slow-to-medium dynamics of the battery, B is the n-by-1 input matrix that directly relates the input to the rate of state variables, and u is the input to the system, i.e., the battery current. A is also the function of the parameters related to battery capacity and dynamics. The number of states, n, in the developed model is optimized with the consideration of the balance between the computational efficiency and prediction fidelity.

A state estimator may be designed from eqns. (26) and (27). By linearizing eqn. (27), a closed-loop estimator may be designed. The linearized expression of eqn. (27) is $$\delta Y = H \delta x \qquad (28)$$

where H matrix is computed by linearizing Y around $x_0$ to design Extended Kalman Filter (EKF).

The output matrix, H, may be derived from:

$$H = \frac{\partial Y}{\partial x} = \frac{\partial U_p(\theta_{se,p})}{\partial x} - \frac{\partial U_n(\theta_{se,n})}{\partial x} \qquad (29)$$

where $\theta_{se,p} = c_{se,p}^{eff}/c_{s,p,max}$ and $\theta_{se,n} = f(c_{p,se}^{eff}, SOC_{ave}) = w_1 c_{p,se}^{eff} + w_2 SOC_{ave}$.

Equation (29) may be further converted to $$H = \frac{\partial Y}{\partial x} = \frac{\partial U_p(\theta_{se,p})}{\partial x} - \frac{\partial U_n(\theta_{se,n})}{\partial f} \frac{\partial f(c_s^{eff})}{\partial x} \qquad (30)$$

Then, expressed in a form of $$H = \frac{\partial U_p}{\partial \theta_{se,p}} \frac{1}{c_{p,max}} G_1 - \frac{\partial U_n}{\partial \theta_{se,n}} \frac{1}{c_{p,max}} (w_1 G_1 + w_2 G_2) \qquad (31)$$

by combining eqns. (21), (22), and (23). where $$\frac{\partial f(c_s^{eff})}{\partial x}$$

is the nonlinear function to map $c_s^{eff}$ to $\theta_{se,n}$. The non-linear function may be determined or identified to capture the dynamics of the output as accurately as possible. Implementing this equation allows modeling the dynamics of both electrodes in the battery with the dynamics of one electrode.

The resulting expression in eqn. (31) is a function of $c_s^{eff}$ of only one electrode. From the estimated of $\hat{c}_s^{eff}$, the battery SOC may be estimated from a non-linear function of eqn. (23).

Figure 10:
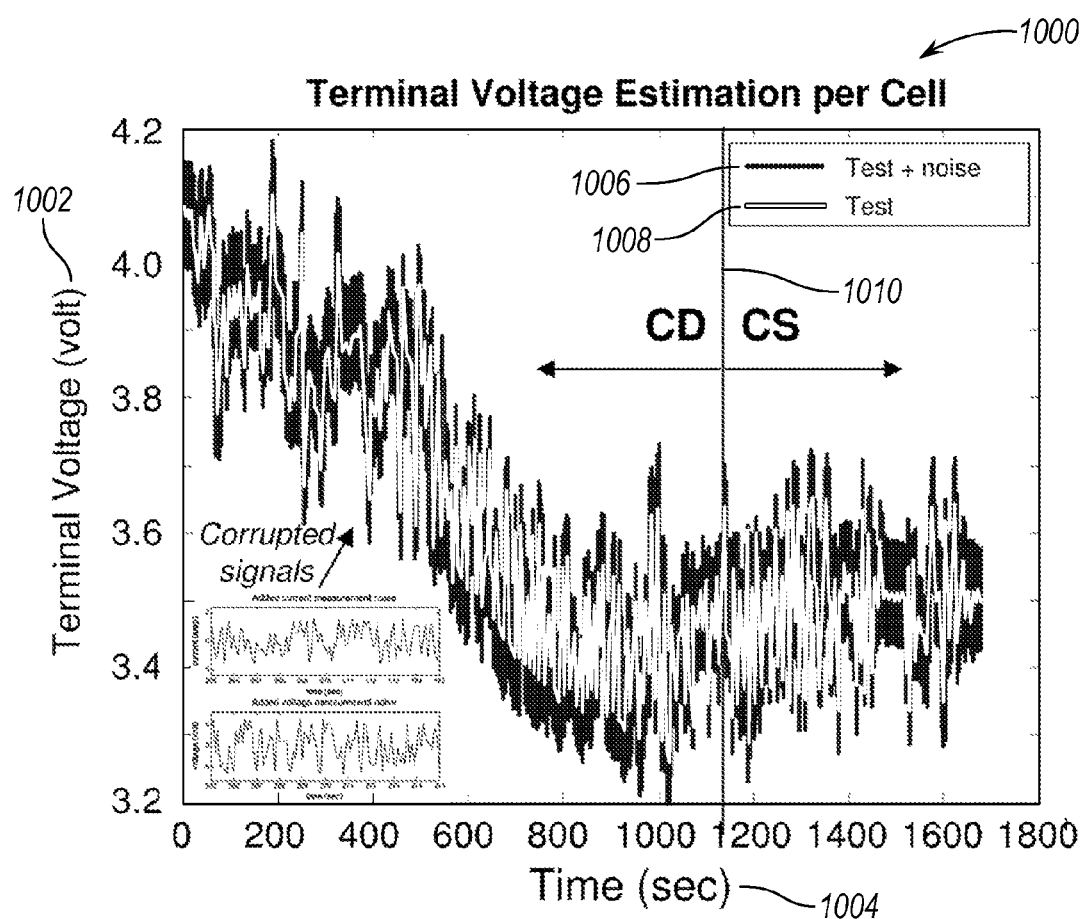
FIG. 10 is graph showing a terminal voltage profile of the battery and a terminal voltage profile of the battery with added noise used as the input to the closed-loop state estimator.

Now referring to FIG. 10, a graph 1000 includes terminal voltage on the y-axis 1002 with respect to time 1004 on the x-axis. A battery terminal voltage 1008 is shown. The battery terminal voltage 1008 fluctuates over time. The terminal voltage 1008 may include noise 1006, which may impede proper operation of the battery control module. The EKF, as disclosed above, may improve the battery terminal voltage estimation by minimizing the noise therein may recover the terminal voltage signal 1008 without noises. Noise may be caused by sensor characteristics, model mismatch, or environmental impacts.

Figure 11:
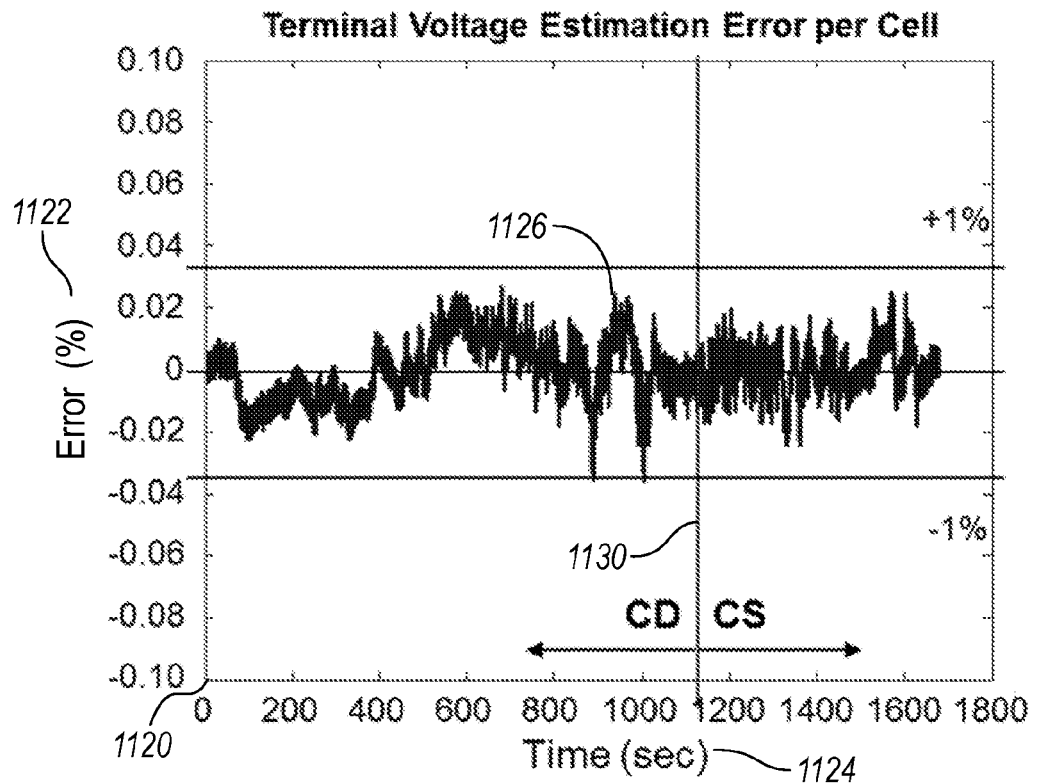
FIG. 11 is a graph showing the terminal voltage estimation error and the comparison between the terminal voltage measurement and the terminal voltage estimation of the Extended Kalman Filter.
Figure 11:
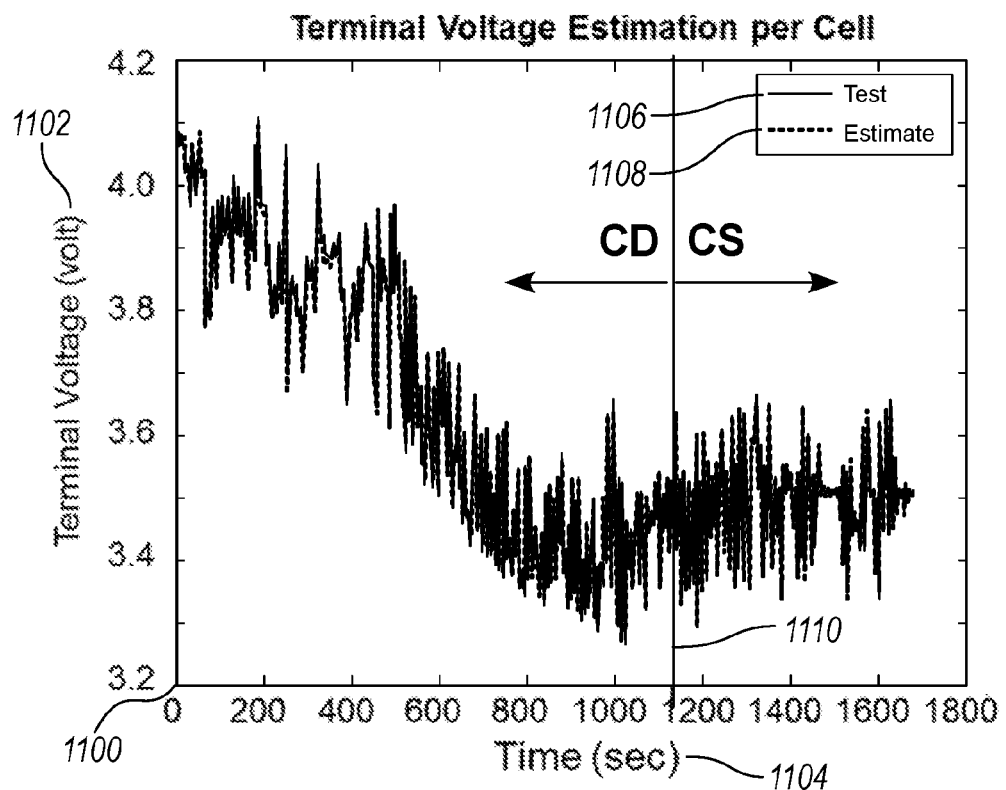

One example of a resulting battery terminal voltage is depicted in FIG. 11. FIG. 11 includes a graph 1100 having terminal voltage on the y-axis 1102 with respect to time 1104 on the x-axis. For clarity, a hypothetical test signal 1106 depicts the terminal voltage of the battery over time in charge depleting or charge sustaining states, as signified by line 1110. An estimate of the terminal voltage 1108, with removed noise from the sensor. The estimate matches the test voltage (as shown without noise). A graph 1120 shows the error 1126 of the estimation of battery terminal voltage 1108 when compared with test signal 1106. The error 1126 is shown on the y-axis 1122 over time on the x-axis 1124. The estimation error 1126 is mostly constant whether to the right or left of the charge depleting or charge sustaining line 1130.

Figure 12:
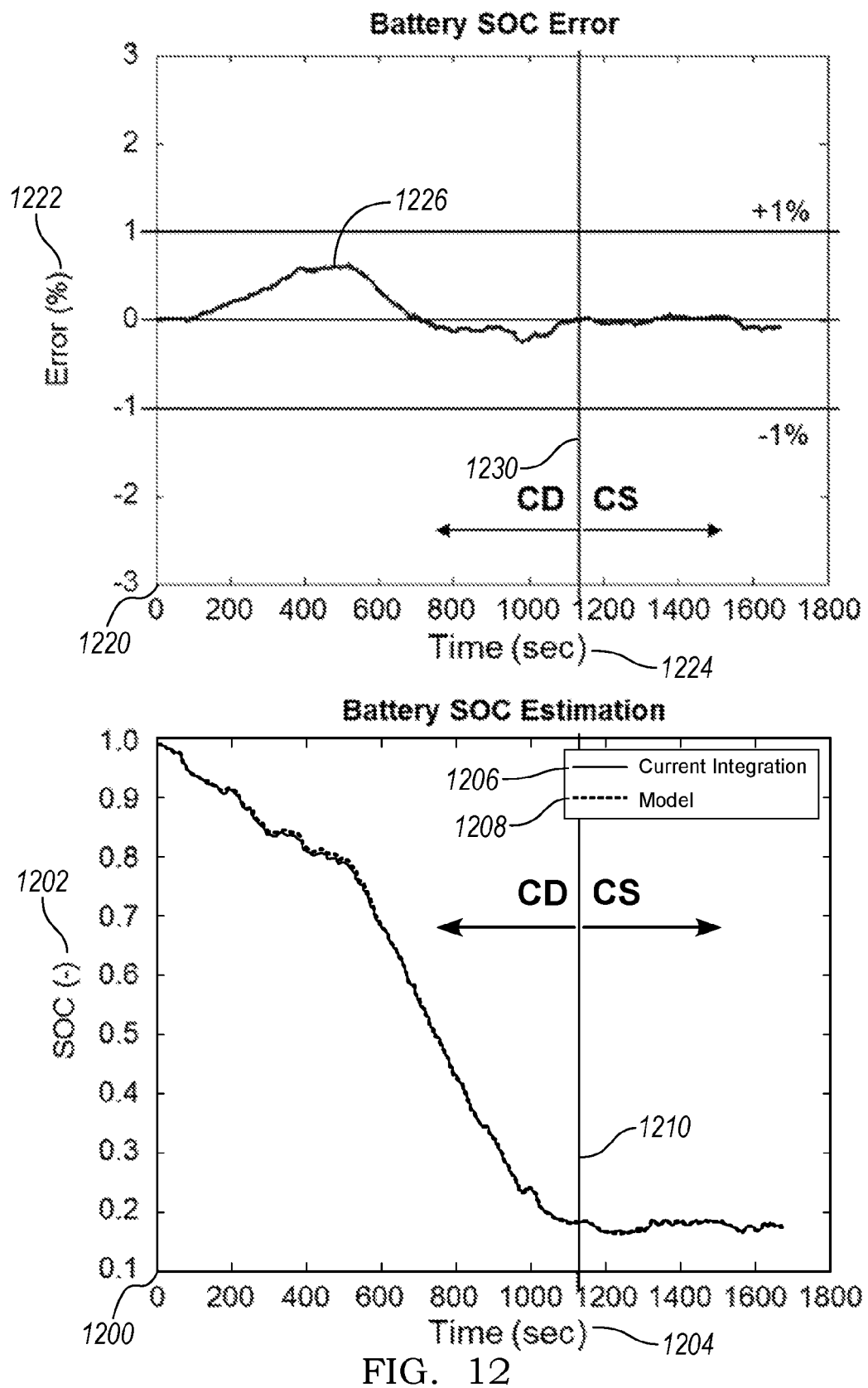
FIG. 12 is a graph showing the battery SOC error and the comparison between the SOC based on current integration and the SOC estimated by the Extended Kalman Filter.

Now referring to FIG. 12, a graph 1200 depicts the battery SOC estimation. As derived from the EKF above the model SOC 1208 is shown as a percentage of SOC on the y-axis 1202 over time of the x-axis 1204. The model SOC 1208 is shown in view of the current integration method SOC 1206. Both operating modes, charge depleting or charge sustaining, are shown on either side of line 1210 with the estimation results of the model SOC 1208. Graph 1200 is shown comparatively next to graph 1220. Graph 1220 depicts the battery SOC estimation error 1226 by virtue of the model SOC 1208 estimate. The battery SOC estimation error 1226 is shown on the y-axis 1222 as a percentage of error with respect to time 1224 on the x-axis. Although minimal errors are present for charge sustaining operation, estimation errors can reach 0.5% in the charge depleting range. These operating modes are shown on either side of line 1230.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
a battery including positive and negative electrodes; and
a controller programmed to charge and discharge the battery according to a state of charge that is based on an effective surface lithium-ion concentration of one of the electrodes, and an effective surface lithium-ion concentration of the other of the electrodes derived from a center-to-surface lithium-ion concentration profile of the one of the electrodes.

2. The vehicle of claim 1, wherein the effective surface lithium-ion concentration of the other of the electrodes is derived via a relationship mapping the center-to-surface lithium-ion concentration profile of the one of the electrodes to the effective surface lithium-ion concentration of the other of the electrodes.

3. The vehicle of claim 2, wherein the relationship is non-linear.

4. The vehicle of claim 1, wherein the effective surface lithium-ion concentration of the one of the electrodes is based on a measured current input and measured voltage output of the battery.

5. A controller comprising:
input channels configured to receive current input and voltage output associated with a battery pack having two electrodes;
output channels configured to provide charge and discharge commands for the battery pack; and
control logic programmed to generate the commands according to a state of charge of the battery pack that is based on an effective surface lithium-ion concentration of one of the electrodes derived from the current input and voltage output, and an effective surface lithium-ion concentration of the other of the electrodes derived from a center-to-surface lithium-ion concentration profile of the one of the electrodes.

6. The controller of claim 5, wherein the effective surface lithium-ion concentration of the other of the electrodes is derived via a relationship mapping the center-to-surface lithium-ion concentration profile of the one of the electrodes to the effective surface lithium-ion concentration of the other of the electrodes.

7. The controller of claim 6, wherein the relationship is non-linear.

8. The controller of claim 5, wherein the effective surface lithium-ion concentration of the one of the electrodes is based on a measured current input and measured voltage output of the battery pack.

9. A vehicle power system comprising:
a controller programmed to charge and discharge a battery according to a state of charge that is based on an effective surface lithium-ion concentration of an electrode of the battery derived from current input and voltage output associated with the battery, and an effective surface lithium-ion concentration of an other of the electrodes of the battery derived from a center-to-surface lithium-ion concentration profile of the electrode.

10. The vehicle power system of claim 9, wherein the effective surface lithium-ion concentration of the other of the electrodes is derived via a relationship mapping the center-to-surface lithium-ion concentration profile of the electrode to the effective surface lithium-ion concentration of the other of the electrodes.

11. The vehicle power system of claim 10, wherein the relationship is non-linear.

12. The vehicle power system of claim 9, wherein the effective surface lithium-ion concentration of the electrode is based on a measured current input and measured voltage output of the battery.

* * * * *